June 3, 1969 J. BUHR 3,448,386
AUTOMATIC MUTING NETWORKS FOR SIGNAL SEEKING RECEIVERS
Filed Dec. 19, 1966

INVENTOR.
JACOB BUHR
BY
PATENT AGENT

United States Patent Office 3,448,386
Patented June 3, 1969

3,448,386

AUTOMATIC MUTING NETWORKS FOR SIGNAL SEEKING RECEIVERS

Jacob Buhr, Kitchener, Ontario, Canada, assignor to Electrohome Limited, Kitchener, Ontario, Canada Filed Dec. 19, 1966, Ser. No. 602,943
Int. Cl. H04b *1/16, 1/32, 1/34*
U.S. Cl. 325—456 6 Claims

ABSTRACT OF THE DISCLOSURE

Automatic muting of a signal received by a signal seeking receiver during the interval when the receiver is searching is achieved using an audio amplifying transistor that has a resistor in its emitter circuit shunted by a low impedance path during the search interval, whereby saturation of the transistor results, whereas this path presents a much higher impedance when the receiver is not searching and is tuned to a signal being received.

During signal seeking it is desirable that the audio output of the receiver be muted automatically, so that noise will not be heard as the tuning condenser is moved between one station and the next. In accordance with this invention, a relatively simple and inexpensive transistor circuit is provided for accomplishing the foregoing objective, the circuit serving as an audio amplifying stage of the receiver when the receiver is tuned to a signal having a strength greater than a minimum predetermined strength.

A signal seeking receiver embodying this invention is of a type having variable tuning means for varying the tuning of the receiver, a motor drivingly connected thereto, whereby the tuning of the receiver can be changed by operation of the motor a first transistor having base, collector and emitter electrodes and means for automatically turning the first transistor off when the receiver is tuned to the frequency of a signal being received by the receiver and of a strength greater than a minimum predetermined signal strength, and on during signal seeking. In accordance with this invention, such a receiver is provided with an audio muting network for automatically muting the audio signal received by the receiver when the first transistor is turned on and the motor is running. The audio muting network comprises an audio amplifying stage including a second transistor for normally amplifying the audio signal to be reproduced by the receiver, means for supplying a bias voltage to forward bias the base-emitter junction of the second transistor, a first resistor connected in circuit with the emitter electrode of the second transistor, and circuit means including the collector and emitter electrodes of the first transistor providing a path shunting the first resistor when the first transistor is turned on for reducing the effective D.C. impedance connected in circuit with the emitter electrode of the second transistor sufficiently to saturate the latter when the first transistor is turned on. The D.C. impedance of the aforementioned path is substantially greater than the resistance of the first resistor when the first transistor is turned off.

Figure 1:
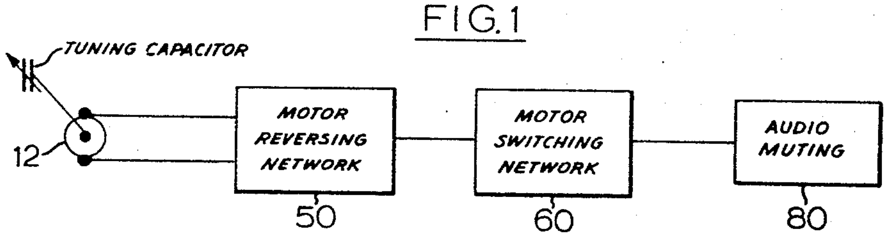
Figure 2:
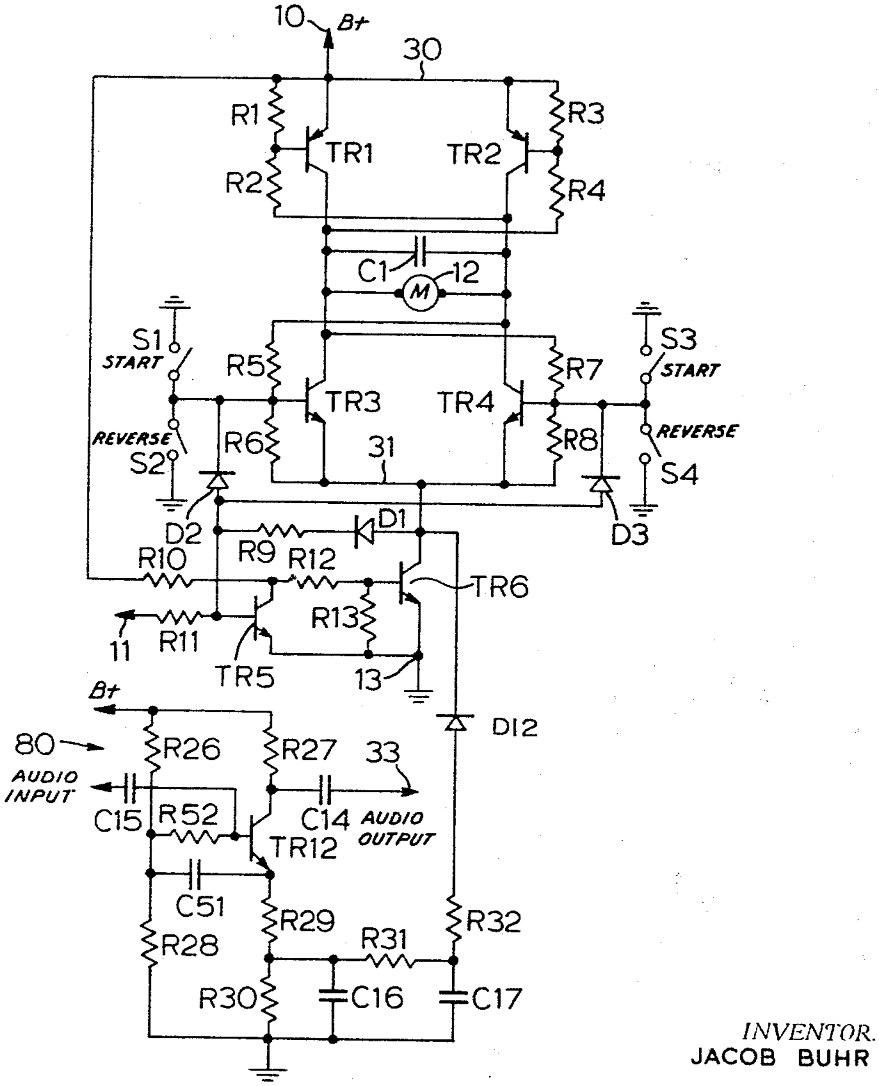

This invention will become more apparent from the following detailed description, taken in conjunction with the appended drawings, in which FIGURES 1 and 2 are block circuit diagrams respectively illustrating a signal seeking receiver embodying this invention.

Referring to FIGURE 1, there is illustrated in block form certain components of a signal seeking receiver. These components consist of a motor reversing network 50, a motor switching network 60, an audio muting network 80 and a motor 12. Motor 12 is drivingly connected to the tuning capacitor of the receiver, whereby, upon operation of the motor, the tuning of the receiver may be varied.

Motor reversing network 50 is shown in greater detail in FIGURE 2, to which reference now is made. The motor reversing network which is illustrated in FIGURE 2 is exemplary only, and those skilled in the art will realize that many different types of motor reversing networks could be used in the practise of this invention. In fact, a motor reversing network is not essential to this invention. In this respect, after the tuning condenser of the receiver has been fully rotated in one direction by motor 12, it could be returned manually to its original position. Motor reversing network 50 includes four transistors; TR1, TR2, TR3, TR4. A source of positive D.C. potential, i.e., a D.C. power supply (B+), is connected to a terminal 10 which, in turn, is connected to a conductor 30. The emitter electrodes of transistors TR1 and TR2 each are connected to conductor 30. Resistors R1 and R3 are connected between conductor 30 and the base electrodes of transistors TR1 and TR2 respectively. A resistor R2 is connected between the base electrode of transistor TR1 and the collector electrode of transistor TR2, while a resistor R4 is connected between the base electrode of transistor TR2 and the collector electrode of transistor TR1. A capacitor C1 is connected between the collector electrodes of transistors TR1 and TR2. Motor 12 also is connected between the collector electrodes of transistors TR1 and TR2. It is assumed that motor 12 is of a type having a permanent magnet field, in which event the armature of motor 12 will be connected as shown in FIGURE 2. However, if motor 12 should have an electromagnetic field, the field coils could be connected between the collector electrodes of transistors TR1 and TR2 with the armature of the motor then being supplied from some other source. Regardless of which arrangement is employed, a reversal in the direction of the current passing through motor 12 will cause a corresponding reversal in the direction of rotation of the motor. The collector electrodes of the transistors TR1 and TR3 are connected together, as are the collector electrodes of transistors TR2 and TR4. The emitter electrodes of transistors TR3 and TR4 are connected by a conductor 31. Resistors R6 and R8 are connected between the base and emitter electrodes of transistors TR3 and TR4 respectively. A resistor R5 is connected between the collector electrode of transistor TR4 and the base electrode of transistor TR3, while a resistor R7 is connected between the collector electrode of transistor TR3 and the base electrode of transistor TR4. The motor reversing network also includes start switches S1 and S3 and reverse switches S2 and S4. Switches S1 and S2 are connetced in parallel with each other between the base electrode of transistor TR3 and a terminal at a reference potential, namely ground potential. Switches S3 and S4 also are connected in parallel with each other but between the base electrode of transistor TR4 and ground.

Motor switching or automatic shut-off network 60 includes two transistors TR5 and TR6, these transistors being so connected that when one is turned on, the other is kept turned off, and vice versa until the state of conduction of the former transistor changes. The collector electrode of transistor TR6 is connected via a diode D1 and a resistor R9 to the base electrode of transistor TR5. The collector electrode of transistor TR5 is connected to the base electrode of transistor TR6 by means of a resistor R12. A resistor R13 is connected in voltage divider relationship with resistor R12, resistor R13 being connected between the base electode of transistor TR6 and a terminal at a reference potential, namely ground potential. The emitter electrodes of transistors TR5 and TR6 both are grounded. Other types of automatic shut-off neworks may be employed without departing from this invention.

As will become more apparent hereinafter, the collector and emitter electrodes of transistor TR6 are connected in a circuit through which the current (armature or field current) required to operate motor 12 must pass. Consequently, motor 12 only can operate if transistor TR6 is turned on. It is to be understood, however, that it is not essential to this invention that either the field or armature current of motor 12 pass through transistor TR6 when this transistor is turned on. All that is required is that a current required for the motor to operate pass through transistor TR6 when it is turned on. For example, this current may flow through the coil of a relay having its contacts in the field or armature circuit of motor 12.

A resistor R10 is connected between B+ and the collector electrode of transistor TR5.

Diodes D2 and D3 are connected between the base electrode of transistor TR5 and the base electrodes of transistor TR3 and TR4 respectively.

A terminal 11 is connected to the base electrode of transistor TR5 by a resistor R11. Terminal 11 may be connected to the ratio detector of the receiver or to some other component of the receiver which provides a D.C. signal when the receiver is tuned to the frequency of a signal being received by the receiver.

Audio muting network 80 is connected to the collector electrode of transistor TR6 via a diode D12 and consists of an audio amplifying stage including a transistor TR12 whose collector electrode is connected to B+ (18–20 volts, for example) via a collector resistor R27. Bias for the transistor is obtained via resistors R26 and R28 connected between B+ and ground, their common terminal being connected to the base electrode of transistor TR12 via a bootstrapping resistor R52. Audio input signals are coupled to the base electrode of transistor TR12 from a preceding audio stage or the detector of the receiver by means of a coupling capacitor C15. A coupling capacitor C14 is connected between the audio output terminal 33 and the collector electrode of transistor TR12. The emitter electrode of transistor TR12 is connected via emitter resistors R29 and R30 to ground. Resistor R30 may be 4.7K.Ω, for example, while resistor R29 may be 180Ω, for example. Resistor R30 is bypassed by a bypass capacitor C16. Connected between the anode of diode D12 and the common terminal of resistors R29 and R30 is a series circuit consisting of resistors R31 and R32, each of which may be 1.0K.Ω, for example. Resistors R31 and R32 permit changes in the bias conditions for transistor TR12 to be achieved, and they also assist in plop suppression. A capacitor C17 is connected between ground and the common terminal of resistors R31 and R32 and serves to keep sudden changes in bias from reaching an objectionable level. A bootstrapping capacitor C51 is connected between the emitter electrode of transistor TR12 and the common terminal of resistors R26 and R28.

The operation of the circuit hereinbefore described now will be discussed.

With switches S1–S4 open, when a positive D.C. potential, B+, which may be 10–12 volts, for example, is applied to terminal 10, transistor TR5 will be biased on, regardless of whether or not there is an input signal present at input terminal 11. With transistor TR5 turned on, transistor TR6 will be kept off, and, as will become more apparent hereinafter, since transistor TR6 must be turned on before motor 12 can start, motor 12 will not operate.

Two paths are provided for the current required to turn on transistors TR5. One path is from terminal 10 via resistors R1, R2, R5 and R6, diode D1 and resistor R9 to the base electrode of transistor TR5. The other path is from terminal 10 via resistors R3, R4, R7 and R8, diode D1 and resistor R9 to the base electrode of transistor TR5. Diode D1 provides a low impedance path for the turn on current which ensures that transistor TR5 will turn on before transistor TR6 when B+ is applied to terminal 10. It will be appreciated that if transistor TR5 were not turned on before transistor TR6, transistor TR6 would be turned on due to current flowing from terminal 10 to terminal 13 via resistors R10, R12 and R13. This would result in transistor TR5 losing its control function.

Diodes D1 presents a high impedance to any positive D.C. signal applied to input terminal 11, by virtue of which excessive loading of this signal is eliminated.

In order to start motor 12, it is necessary to close momentarily either start switch S1 or S3. Assume that start switch S1 is closed momentarily. When switch S1 is closed, diode D2 will establish a low impedance path between the base electrode of transistor TR5 and ground, and the relatively high voltage which, prior to the closing of switch S1, had been applied to the base electrode of transistor TR5 and which kept this transistor turned on, immediately will decrease to the relatively small voltage drop across diode D2. Transistor TR5 then will turn off, with the result that the voltage at its collector electrode will rise. The relatively high voltage at the collector electrode of transistor TR5 will be applied to the base electrode of transistor TR6 via the voltage divider network consisting of resistors R12 and R13, and, whereas when transistor TR5 was turned on and its collector voltage was relatively low, thereby holding transistor TR6 off, now transistor TR6 will turn on because of the increase in the voltage which will be applied to its base electrode when transistor TR5 is turned off. The voltage at the collector electrode of transistor TR6 will drop as soon as this transistor turns on, and this relatively low voltage will be applied to the base electrode of transistor TR5 via diode D1 and resistor R9, thereby keeping transistor TR5 turned off. The voltage at the collector electrode of transistor TR6 when it is turned on is dependent on the saturation voltage of the transistor and typically may be of the order of +0.2 to +0.3 volt. The same sequence of events as outlined hereinbefore would result from the closing of switch S3.

It will be seen from the foregoing that transistors TR5 and TR6 are interconnected in such a manner that when one is on the other is kept off and vice versa until the state of conduction of the former transistor changes.

The closing of switch S1 short circuits, i.e., grounds the base electrode of transistor TR3, so that transistor TR3 can not conduct and its emitter-collector junction will present a high impedance. However, sufficient current will flow from terminal 10 to terminal 13 through the circuit consisting of resistors R3, R4, R7 and R8 and transistor TR6 to turn on transistor TR4. When transistor TR4 is turned on, its emitter-collector junction will present a low impedance, and current then can flow from terminal 10 to terminal 13 via the circuit consisting of resistors R1 and R2 and transistors TR4 and TR6. Transistor TR1 then will turn on. The low voltage drop across transistor TR1 (emitter-collector drop) when transistor TR1 conducts will keep transistor TR2 turned off. Similarly the low voltage drop across the collector-emitter junction of transistor TR4 will keep transistor TR3 turned off. Thus, transistors TR2 and TR3 will be turned off, while transistors TR1 and TR4 will be turned on even after switch S1 is re-opened. Under these conditions, current will flow from terminal 10 to terminal 13 via the circuit consisting of transistor TR1, motor 12, transistor TR4 and transistor TR6, by virtue of which motor 12 will run in one direction and change the setting of the tuning capacitor of the radio receiver. Capacitor C1 has the effect of preventing transistors TR1 and TR2 from oscillating.

Motor 12 will continue to run until a station is tuned in. When a station is tuned in, an input signal in the form of a D.C. voltage will appear at input terminal 11, this signal being derived from the ratio detector, for example, of the receiver, and will turn on transistor TR5, provided that the signal at terminal 11 is above a minimum predetermined signal strength. Transistor TR6 then will turn off, and since motor current must flow through the collector-emitter path of transistor TR6, motor 12 will turn off.

It will be appreciated that if switch S3 had been closed momentarily rather than switch S1, this would initiate a sequence of events leading to the turn on of transistors TR2 and TR3, which, in turn, would keep transistors TR1 and TR4 turned off, and which would result in rotation of motor 12 in a direction opposite to the direction of rotation resulting from the closing of switch S1.

Reversing switches S2 and S4 will be closed momentarily when the tuning gang reaches the limit of its travel in either direction, and the closing of these switches will result in an automatic change in the direction of rotation of motor 12.

A more detailed description of the operation of the network consisting of motor 12 and transistors TR1–TR4 and their associated components will we found in copending Canadian patent application Ser. No. 953,605, filed Mar. 2, 1966—Networks for Controlling the Direction of Rotation of a Direct Current Motor—Jacob Buhr (correspondto United States patent application Ser. No. 531,518, filed Mar. 3, 1966), the disclosure of which is incorporated herein by reference. Other types of motor reversing networks which may be used in the practise of this invention also are disclosed therein.

From the foregoing it will be seen that a network consisting of transistors TR5 and TR6 and their associated components and switches S1–S4 is provided to control the operation of motor 12. This network is so designed that one of the switches must be closed to initiate motor operation, and operation of the motor will be stopped automatically when the receiver tunes in on a station.

When transistor TR6 is conducting and motor 12 is running, so that signal seeking is taking place, it is very desirable that the audio output of the receiver be muted.

Muting is achieved with network 80 by saturation of transistor TR12 when transistor TR6 is on. When transistor TR6 is on and motor 12 is running, the collector voltage of transistor TR6 will be low, say of the order of +0.2 to +0.3 volt, diode D12 will be forward biased, and resistors R31 and R32 in series will shunt resistor R30. This will result in a lowering of the effective resistance in the emitter circuit of transistor TR12, but there will be no change in the base electrode voltage of this transistor, since this is determined by B+ and the size of resistors R26 and R28. Since the emitter voltage transistor TR12 will remain at the base voltage thereof less the $V_{BE}$ of the transistor, there will be an increase in the current through transistor TR12 to maintain the required voltage drop in the emitter circuit of transistor TR12. Transistor TR12 then will be saturated, and the audio output therefrom will be effectively muted, since the voltage swings that it can amplify will be very low.

When transistor TR6 is turned off and motor 12 stops running, the relatively high collector voltage (say +10 volts or more) of this transistor will reverse bias diode D12, no longer will there be a low impedance path shunting resistor R30, and normal operation of network 80 as an audio amplifying stage will resume.

As will be seen from the foregoing, when transistor TR6 is turned off, the D.C. impedance of the path shunting resistor R30 will be very high, since the turn off of transistor TR6 will substantially open circuit this path. In any event, the D.C. path impedance will be much higher than the resistance of resistor R30, so that the resistance in the emitter circuit of transistor TR12 will be substantially the sum of the resistances of R29 and R30. On the other hand, when transistor TR6 is turned on, the resistance in the emitter circuit of transistor TR12 will be considerably less than the sum of the resistances of resistances of resistors R29 and R30.

It is to be understood that it is not essential that transistor TR12 be conected to transistor TR6, although this is definitely preferred. In general, transistor TR12 could be connected to any transistor that is on when motor 12 is running and off when the receiver is tuned to the frequency of a signal being received by the receiver and of a strength greater than a minimum predetermined signal strength, provided that this transistor is connected in a circuit that reduces the effective resistance in the emitter circuit of transistor TR12 sufficiently to saturate transistor TR12 when the former transistor is turned on, this circuit presenting a high resistance when the transistor is turned off.

While preferred embodiments of this invention have been disclosed herein, those skilled in the art will appreciate that changes and modifications may be made therein without departing from the spirit and scope of this invention as defined in the appended claims.

I claim:

1. In a signal seeking receiver of a type having variable tuning means for varying the tuning of said receiver; a motor drivingly connected to said tuning means, whereby the tuning of said receiver can be changed by operation of said motor; a first transistor having base, collector and emitter electrodes, and means for automatically turning said first transistor off when said receiver is tuned to the frequency of a signal being received by said receiver and of a strength greater than a minimum predetermined signal strength and on during signal seeking; an audio muting network for automatically muting the audio signal received by said receiver when said first transistor is turned on and said motor is running, said audio muting network comprising an audio signal amplifying stage including a second transistor for normally amplifying the audio signal to be reproduced by said receiver, said second transistor having base, collector and emitter electrodes, means for supply a bias voltage to forward bias the base-emitter junction of said second transistor, a first resistor connected in circuit with said emitter electrode of said second transistor, and a first circuit including said collector and emitter electrodes of said first transistor providing a path shunting said first resistor when said first transistor is turned on for reducing the effective D.C. impedance connected in circuit with said emitter electrode of said second transistor sufficiently to saturate said second transistor when said first transistor is turned on, the D.C. impedance of said path being substantially greater than the resistance of said first resistor when said first transistor is turned off.

2. The invention according to claim 1 wherein said receiver includes an automatic shut-off network for automatically turning off said motor when said receiver is tuned to the frequency of signal being received by the receiver and of a strength greater than a minimum predetermined signal strength, said automatic shut-off network including said first transistor.

3. The invention according to claim 2 wherein said collector and emitter electrodes of said first transistor are connected in a second circuit through which current required in order for said motor to operate must pass, whereby when said first transistor is turned off said current is unable to flow through said second circuit and said motor ceases operating.

4. The invention according to claim 3 wherein said first circuit also includes at least a second resistor and a diode connected in series circuit with each other in a circuit between said emitter electrode of said second transistor and said collector electrode of said first transistor, said diode being reverse biased when said first transistor is turned off and forward biased when said first transistor is turned on.

5. The invention according to claim 3 including a second resistor connected in a series circuit with said first resistor between said emitter electrode of said second transistor and a terminal at a reference potential; said first and second resistors having a common terminal, and wherein said first circuit includes at least a third resistor and a diode connected in series circuit with each other between said common terminal and said collector electrode of said first transistor, said diode being reverse biased when said first transistor is turned off and forward biased when said first transistor is turned on.

6. The invention according to claim 5, wherein said first circuit includes a fourth resistor, said fourth resistor having a common terminal with said third resistor and being connected in series with said third resistor and said diode; a first capacitor connected between said common terminal of said first and second resistors and said terminal at said reference potential; and a second capacitor connected between said common terminal of said third and fourth resistors and said terminal at said reference potential.

References Cited

UNITED STATES PATENTS

| | | | |
|---|---|---|---|
| 3,334,187 | 8/1967 | Pampel | 325—471 XR |
| 3,374,437 | 3/1968 | Heald | 325—456 XR |

KATHLEEN H. CLAFFY, *Primary Examiner.*

BARRY P. SMITH, *Assistant Examiner.*

U.S. Cl. X.R.

325—471, 478